United States Patent
Chen et al.

(10) Patent No.: US 12,269,732 B2
(45) Date of Patent: Apr. 8, 2025

(54) MEMS MICROPHONE

(71) Applicant: Fortemedia, Inc., Santa Clara, CA (US)

(72) Inventors: Jien-Ming Chen, Tainan (TW);
Chih-Yuan Chen, Tainan (TW);
Feng-Chia Hsu, Tainan (TW);
Wen-Shan Lin, Tainan (TW); Nai-Hao Kuo, Tainan (TW)

(73) Assignee: FORTEMEDIA, INC., Alviso, CA (US)

( * ) Notice: Subject to any disclaimer, the term of this patent is extended or adjusted under 35 U.S.C. 154(b) by 416 days.

(21) Appl. No.: 17/565,773

(22) Filed: Dec. 30, 2021

(65) Prior Publication Data

US 2022/0396469 A1 Dec. 15, 2022

Related U.S. Application Data

(60) Provisional application No. 63/209,440, filed on Jun. 11, 2021.

(51) Int. Cl.
*B81B 3/00* (2006.01)
*H04R 19/04* (2006.01)

(52) U.S. Cl.
CPC .... *B81B 3/0021* (2013.01); *B81B 2201/0257* (2013.01); *B81B 2203/0127* (2013.01); *B81B 2203/019* (2013.01); *B81B 2203/0361* (2013.01)

(58) Field of Classification Search
CPC .............................. H04R 19/04; B81B 3/0051
See application file for complete search history.

(56) References Cited

U.S. PATENT DOCUMENTS

| 10,343,898 B1 | 7/2019 | Chen et al. |
| 10,737,932 B2 | 8/2020 | Lin |
| 2007/0201710 A1* | 8/2007 | Suzuki ............... H04R 31/006 381/174 |
| 2010/0175477 A1* | 7/2010 | Kasai .................... G01H 11/06 73/649 |

(Continued)

FOREIGN PATENT DOCUMENTS

| CN | 107575365 A | 1/2018 |
| CN | 109246565 A | 1/2019 |

(Continued)

OTHER PUBLICATIONS

Chinese language office action dated Jul. 17, 2024, issued in application No. CN 202210319942.0.

(Continued)

*Primary Examiner* — Michele Fan
(74) *Attorney, Agent, or Firm* — McClure, Qualey & Rodack, LLP

(57) ABSTRACT

A micro-electro-mechanical system (MEMS) microphone is provided. The MEMS microphone includes a substrate, a backplate, an insulating layer, and a diaphragm. The substrate has an opening portion. The backplate is disposed on a side of the substrate, with protrusions protruding toward the substrate. The diaphragm is movably disposed between the substrate and the backplate and spaced apart from the backplate by a spacing distance. The protrusions are configured to limit the deformation of the diaphragm when air flows through the opening portion.

9 Claims, 9 Drawing Sheets

(56) References Cited

U.S. PATENT DOCUMENTS

2019/0306630 A1* 10/2019 Jenkins ................ B81B 3/0021

FOREIGN PATENT DOCUMENTS

| CN | 110022519 A |   | 7/2019 |
|----|-------------|---|--------|
| CN | 111147996 A | * | 5/2020 |
| CN | 111434604 A |   | 7/2020 |
| KR | 20190053522 A |   | 5/2019 |

OTHER PUBLICATIONS

Chinese language office action dated Jan. 10, 2025, issued in application No. CN 202210319942.0.

* cited by examiner

MEMS MICROPHONE

CROSS REFERENCE TO RELATED APPLICATIONS

This application claims priority of U.S. Provisional Patent Application No. 63/209,440 filed on Jun. 11, 2021, the entirety of which is incorporated by reference herein.

BACKGROUND OF THE INVENTION

Field of the Invention

The present invention relates to an acoustic transducer, and, in particular, to a micro-electro-mechanical system (MEMS) microphone.

Description of the Related Art

The current trend in personal electronics is toward fabricating slim, compact, lightweight and high-performance electronic devices, including microphones. A microphone is used to receive sound waves and convert acoustic signals into electric signals. Microphones are widely used in daily life and are installed in such electronic products as telephones, mobiles phones, and recording pens. In a capacitive microphone, variations in acoustic pressure (i.e. local pressure deviation from the ambient atmospheric pressure caused by sound waves) force the diaphragm to deform correspondingly, and the deformation of the diaphragm induces a capacitance variation. The variation of acoustic pressure of the sound waves can thus be obtained by detecting the voltage difference caused by the capacitance variation.

This is distinct from conventional electret condenser microphones (ECM), in which mechanical and electronic elements of micro-electro-mechanical system (MEMS) microphones can be integrated on a semiconductor material using integrated circuit (IC) technology to fabricate a miniature microphone. MEMS microphones have such advantages as a compact size, being lightweight, and having low power consumption, and they have therefore entered the mainstream of miniaturized microphones.

Although existing MEMS microphones have generally been adequate for their intended purposes, they have not been entirely satisfactory in all aspects. For example, the compatible acoustic pressure range (i.e. dynamic range) of detectable sound waves in a MEMS microphone still needs improvement. The dynamic range is related to the highest compatible acoustic pressure (i.e. acoustic overload point, which is referred to hereinafter as the "AOP"), which is determined by the harmonic distortion rate (total harmonic distortion, which is referred to hereinafter as the "THD") of the MEMS microphone. On the other hand, if the diaphragm has a lower elastic modulus (i.e. lower stiffness), it can be used to sense a smaller acoustic pressure (i.e. have higher sensitivity), but the THD of the diaphragm will be sacrificed accordingly (i.e. the AOP will be reduced). Therefore, it cannot achieve high AOP, high reliable of air pressure and enhance sensitivity at low frequency, simultaneously, of a MEMS microphone (i.e. unable to achieve a wider dynamic range).

BRIEF SUMMARY OF THE INVENTION

In view of the aforementioned problems, an object of the invention is to provide a MEMS microphone that can achieve high AOP and high reliable of air pressure.

An embodiment of the present invention provides a micro-electro-mechanical system (MEMS) microphone. The MEMS microphone includes a substrate, a backplate, an insulating layer, and a diaphragm. The substrate has an opening portion. The backplate is disposed on a side of the substrate, with protrusions protruding toward the substrate. The diaphragm is movably disposed between the substrate and the backplate and spaced apart from the backplate by a spacing distance. The protrusions are configured to limit the deformation of the diaphragm when air flows through the opening portion.

In some embodiments, the height of the protrusions is greater than one third of the spacing distance.

In some embodiments, the thickness of the backplate is greater than a height of the protrusions.

In some embodiments, the MEMS microphone further includes an island structure on the upper surface of the diaphragm.

In some embodiments, the thickness of the island structure is equal to or greater than the thickness of the diaphragm.

In some embodiments, the island structure includes a plurality of island blocks aligned to each of the protrusions.

In some embodiments, the island structure spans more than one of the protrusions when viewed in a direction perpendicular to the diaphragm.

In some embodiments, the diaphragm extends across the opening portion of the substrate.

In some embodiments, the substrate, the backplate, and the diaphragm are connected through a dielectric layer.

In some embodiments, the MEMS microphone further includes a central pillar connected between the backplate and the diaphragm.

In some embodiments, the MEMS microphone further includes an island structure on the upper surface of the diaphragm, and the island structure is disposed symmetrically around the central pillar.

In some embodiments, the island structure includes a plurality of island blocks aligned to each of the protrusions, and each of the island blocks spans more than one of the protrusions when viewed in a direction perpendicular to the diaphragm.

In some embodiments, a plurality of slots are defined in an annular area of the diaphragm and separated from each other.

In some embodiments, a plurality of vent holes are defined in the diaphragm and separated from each other.

In some embodiments, the MEMS microphone further includes a dynamic valve layer between the substrate and the backplate, wherein the dynamic valve layer includes a flap portion covering at least a vent hole of the diaphragm when viewed in a direction that is perpendicular to the diaphragm, and the flap portion deforms when air flows through the vent hole.

BRIEF DESCRIPTION OF THE DRAWINGS

The present invention can be more fully understood from the following detailed description when read with the accompanying drawings. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
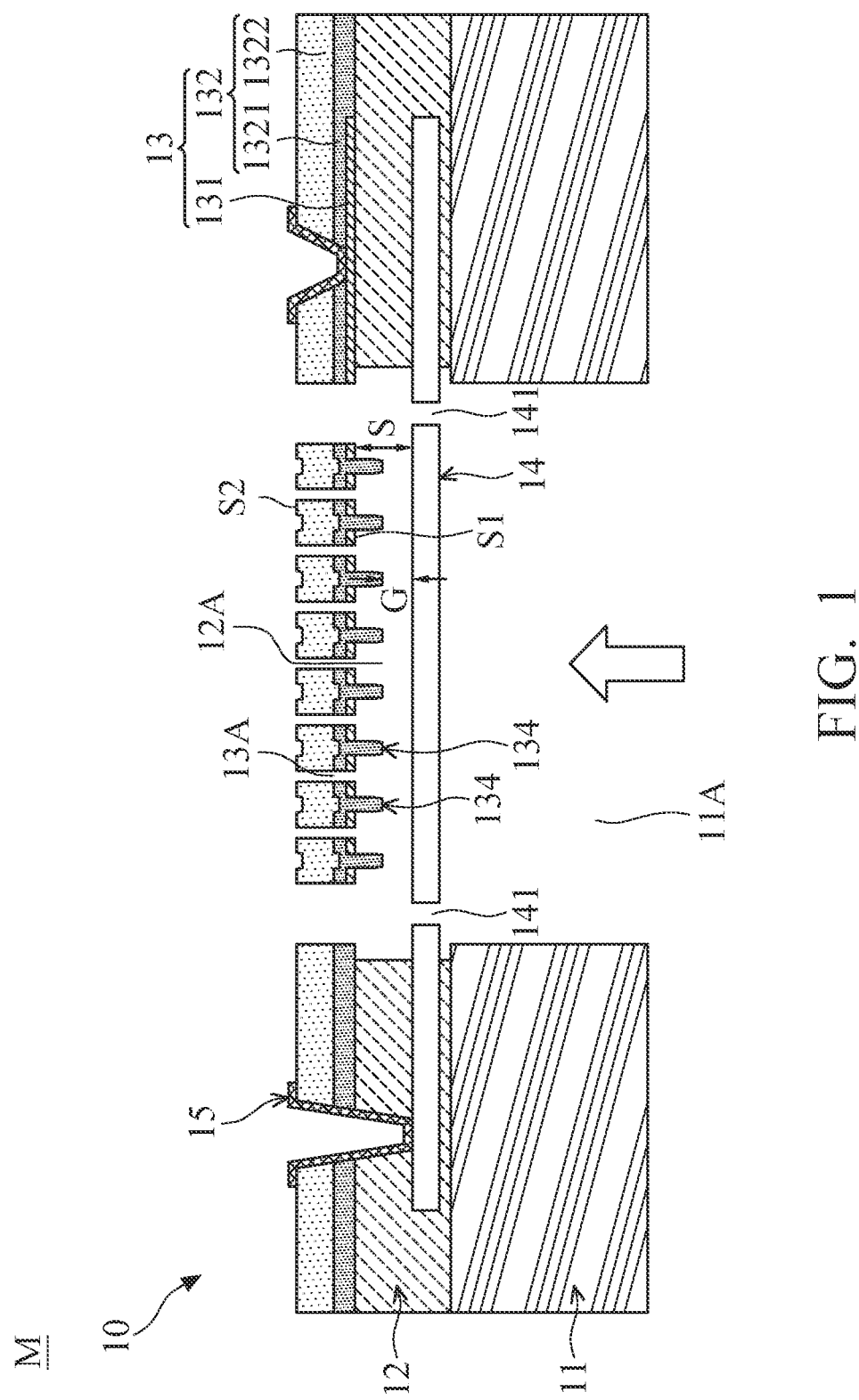
FIG. 1 illustrates a cross-sectional view of a MEMS microphone, in accordance with some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used in this article have the same meanings as understood by the person having ordinary skill in the art to which the content of the present disclosure belongs. Terms, such as those defined in commonly used dictionaries, should be interpreted as having meanings consistent with the meanings in related fields, and should not be interpreted in an idealized or overly formal sense, unless explicitly defined here.

In the present disclosure, a micro-electro-mechanical system (MEMS) microphone for detecting sound waves and converting the sound waves (acoustic signal) into electric signal is provided, in accordance with various exemplary embodiments. In particular, by configuring protrusions on the backplate to limit the deformation of the diaphragm when air flows through the opening portion, the MEMS microphones in the various embodiments can prevent the diaphragm from breaking. As a result, the MEMS microphone of the present disclosure may achieve high reliable of air pressure. The variations of some embodiments are also discussed. Throughout the various views and illustrative embodiments, like reference numbers are used to designate like elements.

FIG. 1 illustrates a cross-sectional view of a MEMS microphone M, in accordance with some embodiments of the present disclosure. It should be noted that the MEMS microphone M depicted in FIG. 1 has been simplified for the sake of clarity to better understand the inventive concepts of the present disclosure. Additional features can be added into the MEMS microphone M, and some of the features described below can be replaced or eliminated in other embodiments of the MEMS microphone M. As shown in FIG. 1, the MEMS microphone M which is a capacitive microphone includes a MEMS structure 10 including a substrate 11, a dielectric layer 12, a backplate 13, a diaphragm 14, and an electrode layer 15.

The substrate 11 is configured to support the dielectric layer 12, the backplate 13, the diaphragm 14, and the electrode layer 15 on a side thereof. The substrate 11 may have an opening portion 11A which allows sound waves (e.g., as indicated by the arrow in FIG. 1) received by the MEMS microphone M to pass through and/or enter the MEMS structure 10. The substrate 11 may be made of silicon or the like.

The dielectric layer 12 is disposed between the substrate 11 and the diaphragm 14, and between the diaphragm 14 and the backplate 13, so as to provide partial isolation between the substrate 11, the diaphragm 14, and the backplate 13 from each other. Moreover, the dielectric layer 12 is disposed around the backplate 13 and the diaphragm 14, such that the backplate 13 and the diaphragm 14 are clamped at their edges by the dielectric layer 12. Accordingly, the substrate 11, the backplate 13, and the diaphragm 14 are connected through the dielectric layer 12. Furthermore, the dielectric layer 12 may have an opening portion 12A corresponding to the opening portion 11A of the substrate 11, so as to allow the sound waves to pass through the diaphragm 14 and the backplate 13 and then leave the MEMS structure 10. The dielectric layer 12 may be made of silicon oxide or the like.

The backplate 13 is a stationary element disposed on a side of the substrate 11. The backplate 13 may have sufficient stiffness such that it would not be bending or movable when the sound waves pass through the backplate 13. In some embodiments, the backplate 13 is a stiff perforated element including a number of acoustic holes 13A each passing through the backplate 13, as shown in FIG. 1. The acoustic holes 13A are configured to allow the sound waves to pass through.

In some embodiments, the backplate 13 includes a conductive layer 131 and an insulating layer 132 covering the conductive layer 131 for protection, as shown in FIG. 1. The conductive layer 131 and the insulating layer 132 are respectively located on a first side S1 of the backplate 13 facing the diaphragm 14 and a second side S2 of the backplate 13 opposite to the first side S1. The conductive layer 131 may be made of poly-silicon or the like, and the insulating layer 132 may be made of silicon nitride or the like.

In some embodiments, the MEMS structure 10 is electrically connected to a circuit (not shown) via several electrode pads of the electrode layer 15 that is disposed on the backplate 13 and electrically connected to the conductive layer 131 and the diaphragm 14. In some embodiments, the electrode layer 15 includes copper, silver, gold, aluminum, or alloy thereof.

The diaphragm 14 is movable or displaceable relative to the backplate 13, wherein the diaphragm 14 is movably disposed between the substrate 11 and the backplate 13 and spaced apart from the backplate by a spacing distance S. As shown in FIG. 1, the diaphragm 14 may extend across the opening portion 11A of the substrate 11. The diaphragm 14 is configured to sense the sound waves received by the MEMS microphone M.

The displacement change of the diaphragm 14 relative to the backplate 13 causes a capacitance change between the diaphragm 14 and the backplate 13. The capacitance change is then converted into an electric signal by circuitry connected with the diaphragm 14 and the backplate 13, and the electrical signal is sent out of the MEMS microphone M through the electrode layer 15.

Figure 3A:
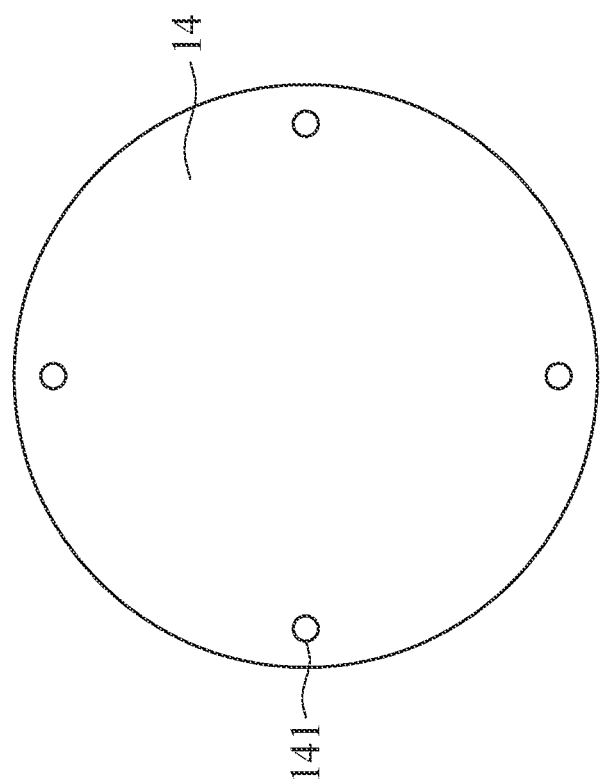
FIGS. 3A and 3B illustrate cross-sectional views of a diaphragm, in accordance with some embodiments of the present disclosure.

On the other hand, in order to increase the sensitivity of the diaphragm 14, a plurality of vent holes 141 may be provided in the diaphragm 14 and to serve as a spring in the diaphragm 14 to reduce the stiffness of the diaphragm 14. FIG. 3A illustrates a cross-sectional view of the diaphragm 14 with the vent holes 141, in accordance with some embodiments of the present disclosure. In some alternative embodiments, there may be more than two vent holes 141. With this structural feature, high sensitivity of the MEMS microphone M can be achieved. In addition, the vent holes 141 in the diaphragm 14 are also configured to relieve the high air pressure on the diaphragm 14.

In some embodiments, a number of protrusions 134 protruding toward the substrate 11 are provided or formed on the first side S1 of the backplate 13, and an air gap G is formed between the diaphragm 14 and each of the protrusions 134, as shown in FIG. 1. In addition, the air gap G between the diaphragm 14 and each of the protrusions 134 may be the same (but not limited thereto).

Still referring to FIG. 1, to form the protrusions 134, the insulating layer 132 of the backplate 13 may include a first insulating layer 1321 and a second insulating layer 1322 stacked on the first insulating layer 1321. As shown in FIG. 1, the protrusions 134 may be formed to protrude from the first insulating layer. In some embodiments, the first and second insulating layers 1321 and 1322 may include the same material or different material.

In the present disclosure, the protrusions 134 are configured to limit the deformation of the diaphragm 14 when air flows through the opening portion 11A, and the MEMS microphones M can prevent the diaphragm 14 from breaking. Accordingly, the MEMS microphone of the present disclosure may achieve high reliable of air pressure.

In some embodiments, for example, the height of the protrusions 134 is greater than one third of the spacing distance S (i.e., the air gap G is less than two thirds of the spacing distance S). Therefore, the elongated protrusions 134 may be in contact with the diaphragm 14 when air flows through the opening portion 11A, which further limits the deformation of the diaphragm 14 and prevents the diaphragm 14 from breaking.

To further limit any deformation of the diaphragm 14, in some embodiments, the backplate 13 is configured to avoid deformation thereof upon air pressure. For example, the toughness, stress, stiffness, or other properties of the backplate 13 are adjusted to limit the deformation of the backplate 13 and thus the deformation of the diaphragm 14 when air flows through the opening portion 11A. In some embodiments, the thickness of the backplate 13 is configured to be greater than the height of the protrusions 134 to increase the stiffness of the backplate 13. Therefore, the reinforced backplate 13 may limit the deformation of the diaphragm 14 and prevent the diaphragm 14 from breaking when air flows through the opening portion 11A.

Figure 2:
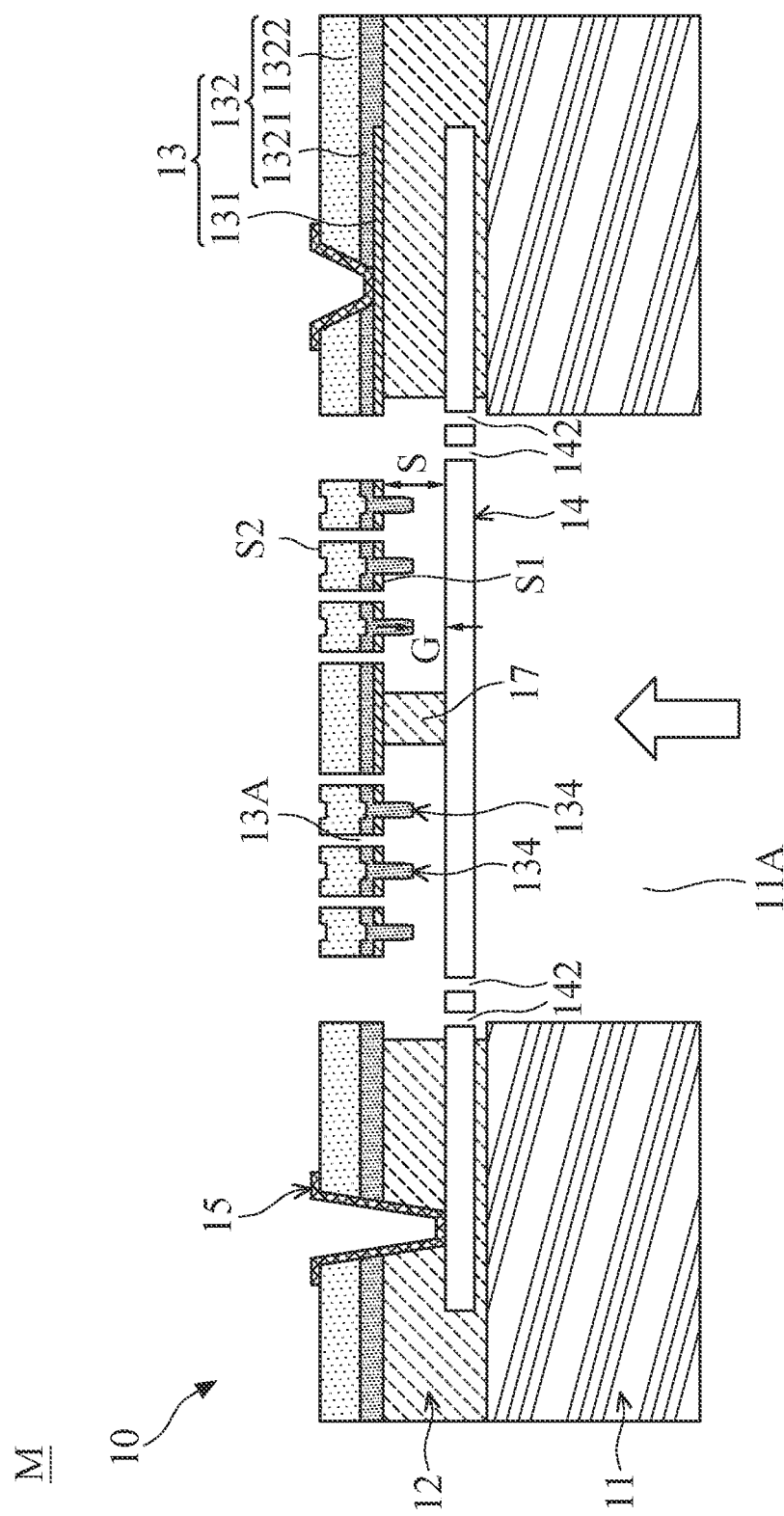
FIG. 2 illustrates a cross-sectional view of a MEMS microphone, in accordance with another embodiments of the present disclosure.

FIG. 2 illustrates a cross-sectional view of a MEMS microphone M, in accordance with another embodiment of the present disclosure. Referring to FIG. 2, the MEMS microphone M may further include a central pillar 17 connected between the backplate 13 and the diaphragm 14, so as to support the center region of the diaphragm 14 and increase the AOP of the diaphragm 14. In addition, the protrusions 134 surrounding the central pillar 17 may limit the deformation of the diaphragm 14 and prevents the diaphragm 14 from breaking when air flows through the opening portion 11A.

Figure 3B:
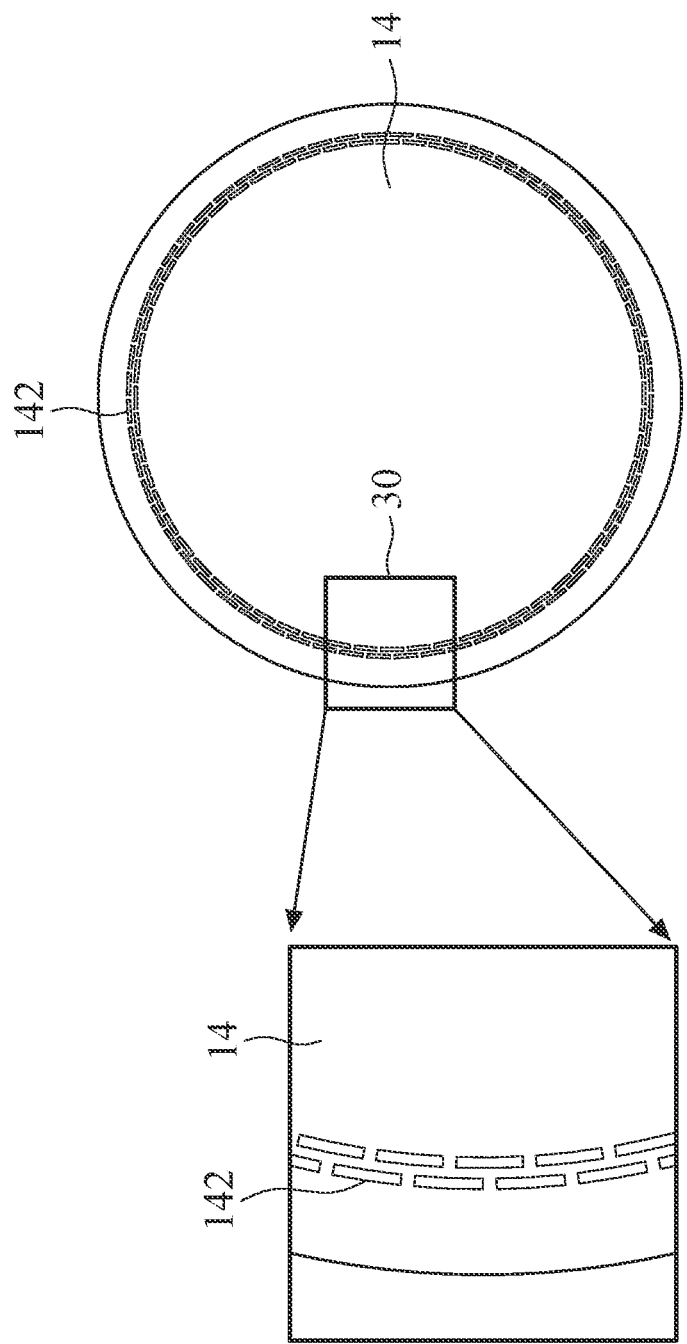

On the other hand, in order to increase the sensitivity of the diaphragm 14, a plurality of slots 142 may be provided in the diaphragm 14. FIG. 3B illustrates a cross-sectional view of the diaphragm 14 with the slots 142, in accordance with some embodiments of the present disclosure. Comparing to the vent holes 141 shown in FIG. 3A, the plurality of slots 142 are openings with more elongated and curved shapes. In some embodiments, the plurality of slots 142 in the diaphragm 14 are arranged in concentric circles close to the dielectric layer 12 (e.g., between the conductive layer 131 of the backplate 13 and the dielectric layer 12). In addition, as shown in a magnified view 30 of the diaphragm 14 in FIG. 3B, the plurality of slots 142 of adjacent circles may be arranged alternately, so that the plurality of slots 142 can serve as a spring in the diaphragm 14 to reduce the stiffness of the diaphragm 14. In some alternative embodiments, the number of concentric circles formed by the plurality of slots 142 may be more than two. With this structural feature, high sensitivity of the MEMS microphone M can be achieved.

FIGS. 4A-4D illustrates cross-sectional views of a MEMS microphone, in accordance with some other embodiments of the present disclosure. In the following embodiments, the MEMS structure 10 further includes an isolation structure 16 on the upper surface of the diaphragm 14. As shown in FIG. 4A-4D, the thickness of the island structure 16 may be equal to or greater than the thickness of the diaphragm. It is noted that in the presence of the isolation structure 16, the height of the protrusions may be shorter comparing to the cases without any isolation structure. By forming the isolation structure 16 on the upper surface of the diaphragm 14, the isolation structure 16 may be in contact with the backplate 13 (in particular, in contact with the protrusions 134 of the backplate 13) when air flows through the opening portion 11A, which further limits the deformation of the diaphragm 14 and prevents the diaphragm 14 from breaking.

Figure 4A:
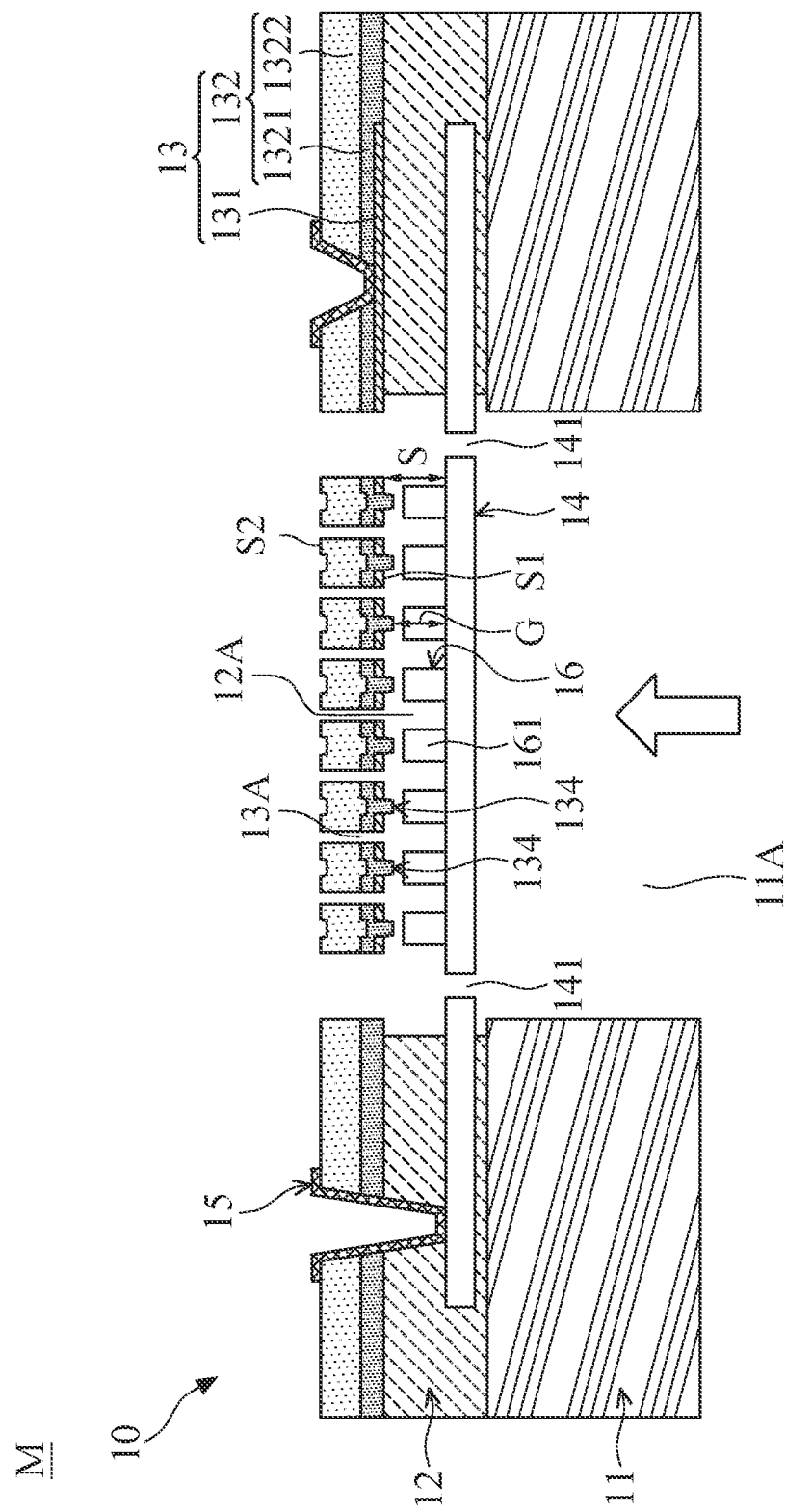
FIGS. 4A-4D illustrates cross-sectional views of a MEMS microphone, in accordance with some other embodiments of the present disclosure.
Figure 4B:
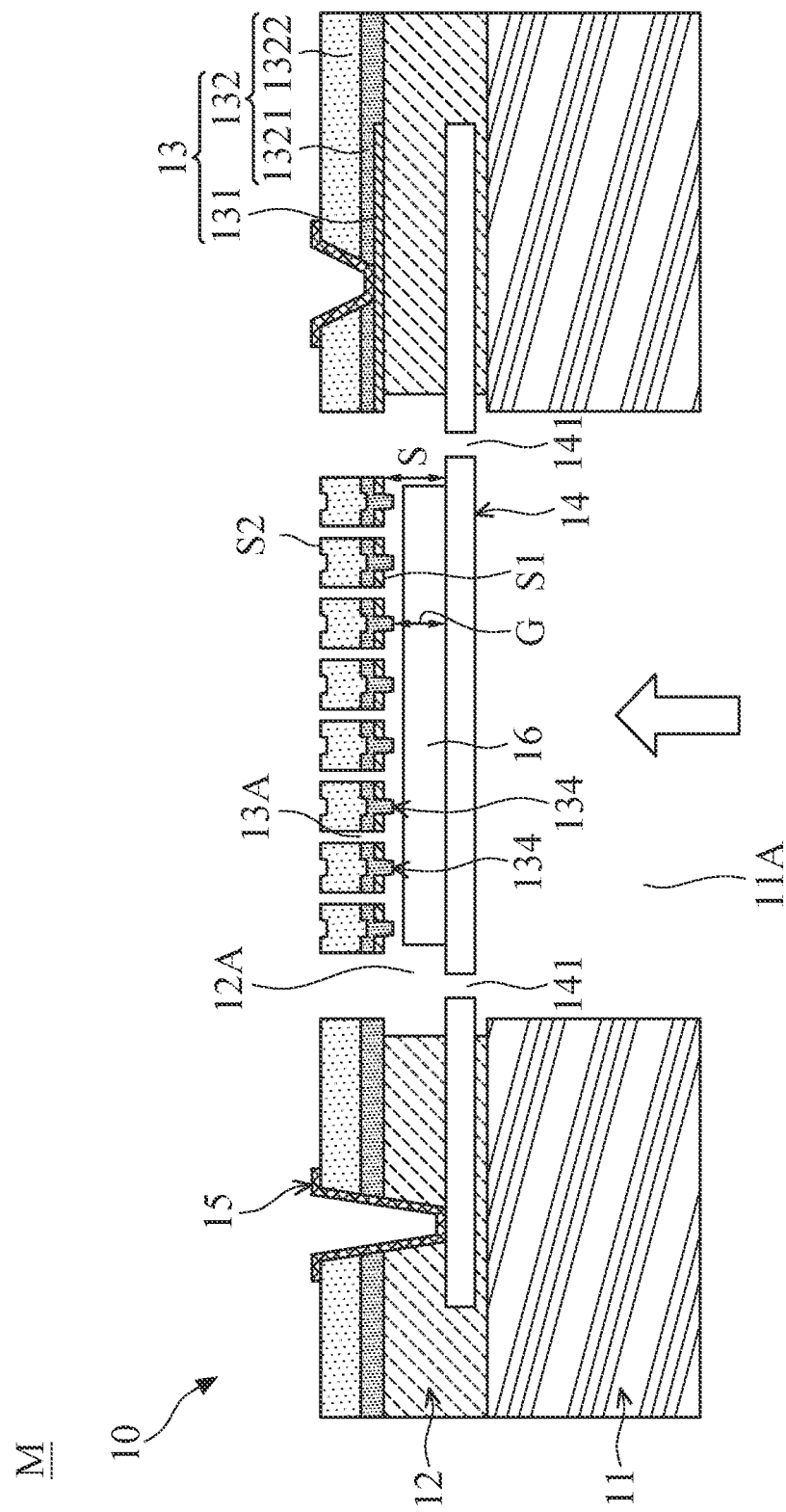

As shown in FIG. 4A, the island structure 16 may include a plurality of island blocks 161 aligned to each of the protrusions 134. However, as shown in FIG. 4B, the island structure 16 may also spans more than one of the protrusions 134 when viewed in a direction perpendicular to the diaphragm 14.

Figure 4C:
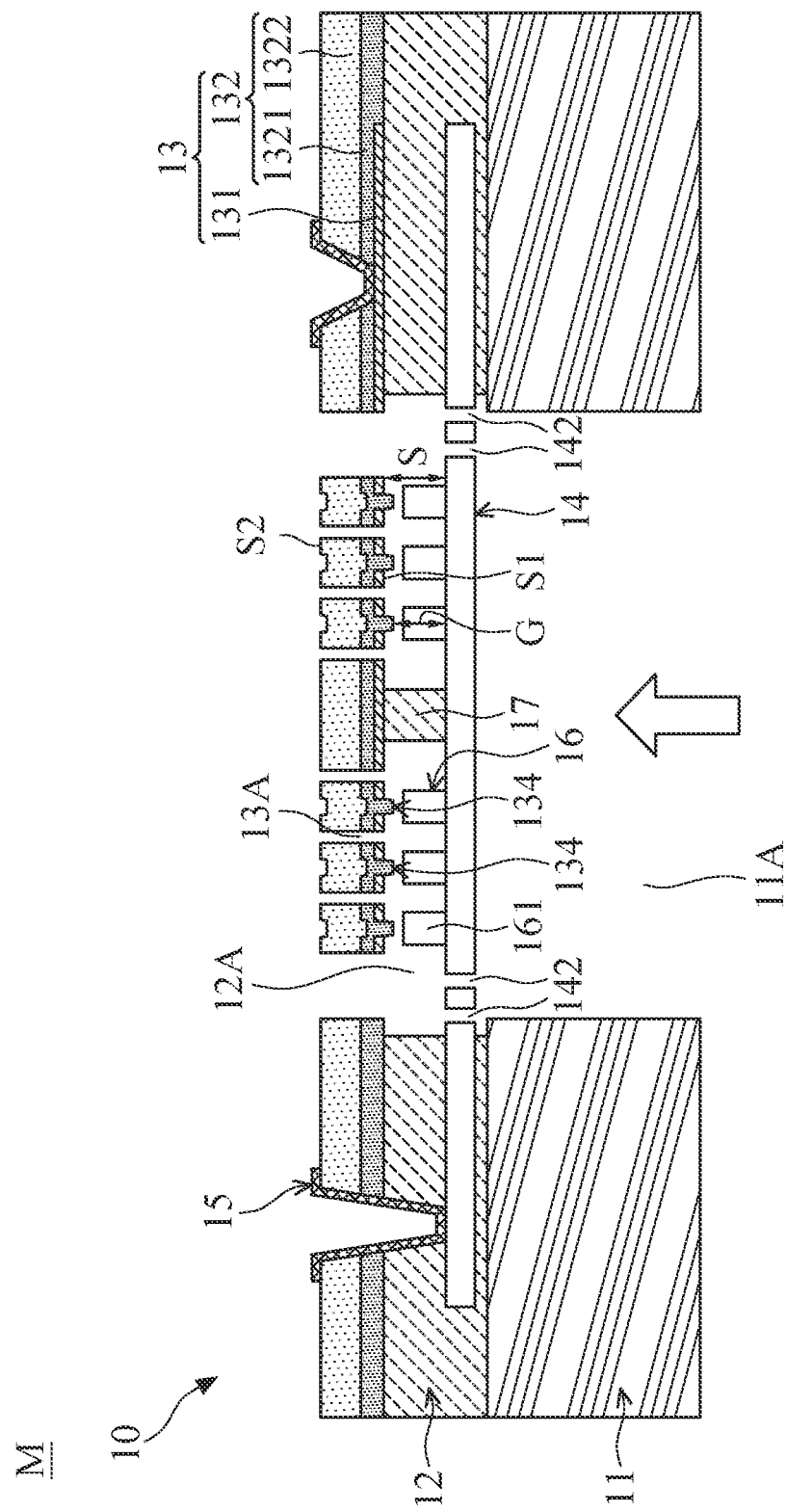
Figure 4D:
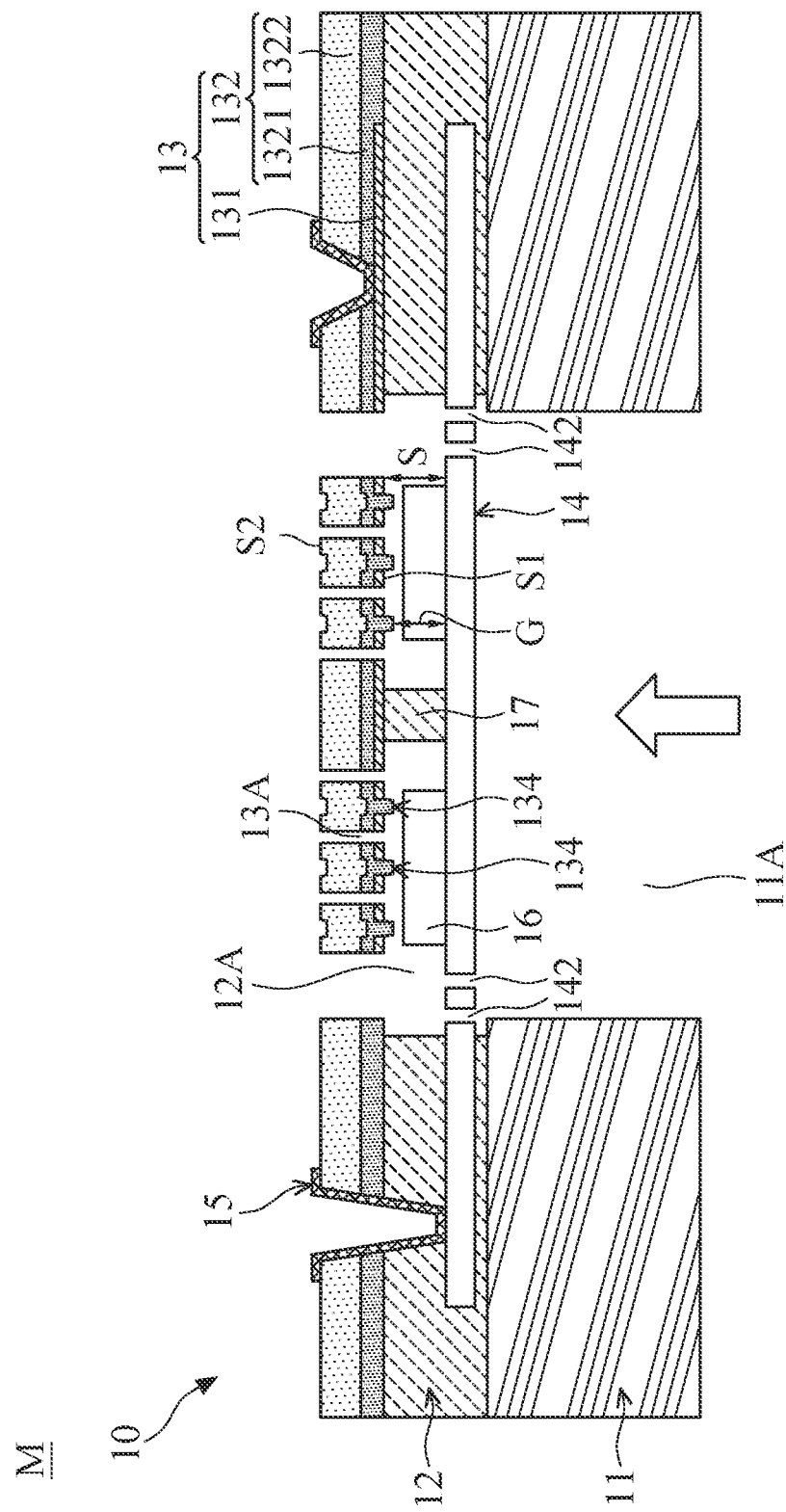

Referring to FIGS. 4C and 4D, the MEMS structure 10 may also include both the island structure 16 and the central pillar 17 between the backplate 13 and the diaphragm 14. In some embodiments, as shown in FIGS. 4C and 4D, the island structure 16 is disposed symmetrically around the central pillar 17. Accordingly, the protrusions 134, the island structure 16, and the central pillar 17 may limit the deformation of the diaphragm 14 concurrently when air flows through the opening portion 11A, while the central pillar 17 may also support the center region of the diaphragm 14 and increase the AOP of the diaphragm 14.

Similar to the embodiments without the central pillar 17, as shown in FIG. 4C, the symmetrically disposed island structure 16 may include a plurality of island blocks 161 aligned to each of the protrusions 134. However, as shown in FIG. 4D, the symmetrically disposed island structure 16 may also spans more than one of the protrusions 134 when viewed in a direction perpendicular to the diaphragm 14.

Figure 5:
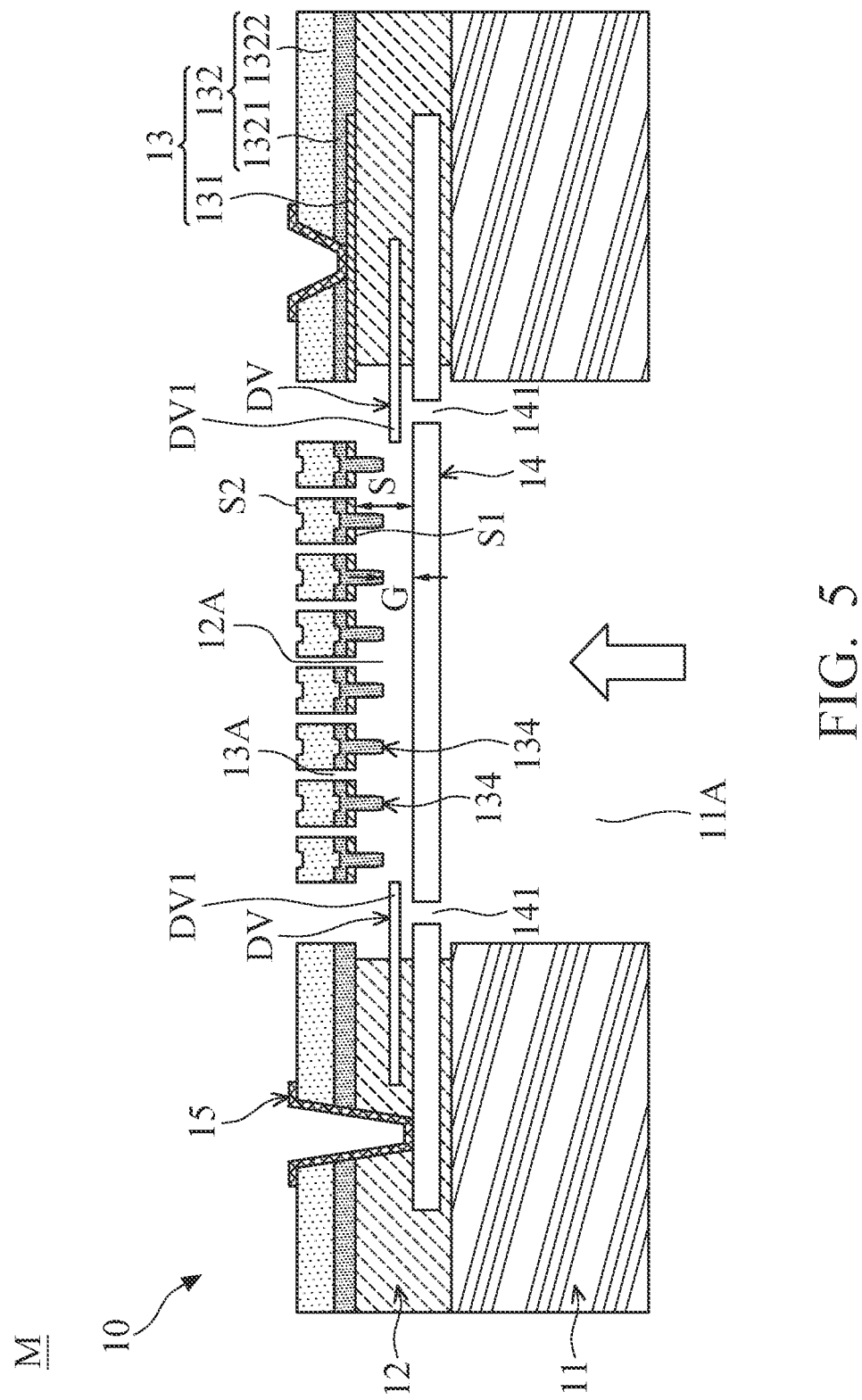
FIG. 5 illustrates a cross-sectional view of a MEMS microphone, in accordance with yet another embodiment of the present disclosure.

FIG. 5 illustrates a cross-sectional view of a MEMS microphone M, in accordance with yet another embodiment of the present disclosure. In some embodiments, the MEMS structure 10 further includes a dynamic valve layer DV between the substrate 1 land the backplate 13. In addition, the dynamic valve layer DV is embedded in to the dielectric layer 12 and has at least one flap portion DV1 protruding from the dielectric layer 12 and spaced apart from the diaphragm 14. The flap portion DV1 may cover at least a vent hole 141 (or a slot) of the diaphragm 14 when viewed in a direction perpendicular to the diaphragm 14. When the diaphragm 14 is affected by acoustic pressure from ambient sound waves, air can flow sequentially through the opening 11A and the vent holes 141, as indicated by the arrow in FIG. 5, so that the flap portions DV1 of the dynamic valve layer DV deform to relieve the air pressure and endure the wind load on the diaphragm 14. As shown in FIG. 5, although the dynamic valve layer DV is disposed between the diaphragm 14 and the backplate 13, the present disclosure is not limited thereto. In some other embodiments, the dynamic valve layer DV is disposed between the diaphragm 14 and the substrate 11. Therefore, air can flow sequentially through the acoustic holes 13A and the vent holes 141, so that the flap portions DV1 of the dynamic valve layer DV deform to relieve the air pressure and endure the wind load on the diaphragm 14.

In summary, a micro-electro-mechanical system (MEMS) microphone for detecting sound waves and converting the sound waves (acoustic signal) into electric signal is provided, in accordance with various exemplary embodiments. In particular, by configuring protrusions on the backplate to limit the deformation of the diaphragm when air flows through the opening portion, the MEMS microphones in the various embodiments can prevent the diaphragm from breaking. As a result, the MEMS microphone of the present disclosure may achieve high reliable of air pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electro-mechanical system (MEMS) microphone, comprising:
    a substrate having an opening portion;
    a backplate disposed on a side of the substrate, with protrusions protruding toward the substrate;
    a diaphragm movably disposed between the substrate and the backplate and spaced apart from the backplate by a spacing distance,
    wherein the protrusions are configured to limit deformation of the diaphragm when air flows through the opening portion;
    a central pillar connected between the backplate and the diaphragm; and
    an island structure on an upper surface of the diaphragm, and the island structure is disposed symmetrically around the central pillar,
    wherein the island structure comprises a plurality of island blocks aligned to each of the protrusions, and each of the island blocks spans more than one of the protrusions when viewed in a direction perpendicular to the diaphragm.

2. The micro-electro-mechanical system (MEMS) microphone of claim 1, wherein a height of the protrusions is greater than one third of the spacing distance.

3. The micro-electro-mechanical system (MEMS) microphone of claim 1, wherein a thickness of the backplate is greater than a height of the protrusions.

4. The micro-electro-mechanical system (MEMS) microphone of claim 1, further comprising an island structure on an upper surface of the diaphragm.

5. The micro-electro-mechanical system (MEMS) microphone of claim 1, wherein a thickness of the island structure is equal to or greater than a thickness of the diaphragm.

6. The micro-electro-mechanical system (MEMS) microphone of claim 4, wherein the island structure spans more than one of the protrusions when viewed in a direction perpendicular to the diaphragm.

7. The micro-electro-mechanical system (MEMS) microphone of claim 1, wherein the diaphragm extends across the opening portion of the substrate.

8. The micro-electro-mechanical system (MEMS) microphone of claim 1, wherein the substrate, the backplate, and the diaphragm are connected through a dielectric layer.

9. The micro-electro-mechanical system (MEMS) microphone of claim 1, wherein a plurality of slots are defined in an annular area of the diaphragm and separated from each other.

* * * * *